United States Patent [19]

Koury, Jr.

[11] Patent Number: 4,902,641
[45] Date of Patent: Feb. 20, 1990

[54] PROCESS FOR MAKING AN INVERTED SILICON-ON-INSULATOR SEMICONDUCTOR DEVICE HAVING A PEDESTAL STRUCTURE

[75] Inventor: Daniel N. Koury, Jr., Ithaca, N.Y.
[73] Assignee: Motorola, Inc., Schaumburg, Ill.
[21] Appl. No.: 79,984
[22] Filed: Jul. 31, 1987
[51] Int. Cl.$^4$ ............ H01L 21/76; H01L 21/20
[52] U.S. Cl. ............ 437/62; 148/DIG. 11;
148/DIG. 26; 148/DIG. 50; 148/DIG. 53;
148/DIG. 135; 156/657; 156/662; 357/23.1;
357/55; 437/33; 437/40; 437/90; 437/86;
437/915; 437/193; 437/974
[58] Field of Search ............ 437/29, 31, 41, 90,
437/99, 103, 86, 89, 62, 203, 239, 915, 974, 193;
148/DIG. 11, 26, 50, 53, 117, 122, 135, 164;
156/644, 653, 657; 357/34, 22, 23.4, 59 G, 59 K,
50, 55, 40, 33, 81

[56] References Cited

U.S. PATENT DOCUMENTS

| | | |
|---|---|---|
| 3,508,980 | 4/1970 | Jackson, Jr. et al. ............ 437/6 |
| 3,575,731 | 4/1971 | Hoshi et al. ............ 437/86 |
| 3,600,651 | 8/1971 | Duncan ............ 148/DIG. 167 |
| 3,959,045 | 5/1976 | Antypas ............ 437/86 |
| 4,142,925 | 3/1979 | King et al. ............ 156/657 |
| 4,230,505 | 10/1980 | Wu et al. ............ 156/657 |
| 4,556,585 | 12/1985 | Abernathey et al. ............ 437/56 |
| 4,649,627 | 3/1987 | Abernathey et al. ..... 148/DIG. 164 |
| 4,651,407 | 3/1987 | Bencuya ............ 357/22 |
| 4,663,831 | 5/1987 | Birritella et al. ............ 148/DIG. 26 |
| 4,686,758 | 8/1987 | Liu et al. ............ 357/23.4 |
| 4,696,097 | 9/1987 | McLaughlin et al. ............ 437/193 |

OTHER PUBLICATIONS

Shinchi et al., "The Buried Oxide MOSFET-a New Type of High-Speed Switching Device," IEEE Trans. on Electron Devices, Oct. 1976, pp. 1190–1191.
Arienzo et al., "Simple Technique to Make Symmetrical Transistors", IBM Technical Disclosure Bulletin, vol. 27, No. 4B, Sep. 1984, pp. 2371–2373.
Tang et al., "A Symmetrical Bipolar Structure," IEEE Electron Devices Meeting, Dec. 8–10, 1980, pp. 58–60.
Ning et al., "MOSFET Structure", IBM TDB vol. 25, No. 3A, Aug. 1982, pp. 1179–1182.

Primary Examiner—Brian E. Hearn
Assistant Examiner—William Bunch
Attorney, Agent, or Firm—Harry A. Wolin

[57] ABSTRACT

A process for making an inverted silicon-on-insulator semiconductor device having a pedestal structure. After the processing of polysilicon layers, dielectric layers, an epitaxial region and a nitride layer, a second substrate is bonded to the nitride layer and the first substrate is removed. This allows for an epitaxial region which is isolated from the substrate.

21 Claims, 6 Drawing Sheets

PROCESS FOR MAKING AN INVERTED SILICON-ON-INSULATOR SEMICONDUCTOR DEVICE HAVING A PEDESTAL STRUCTURE

BACKGROUND OF THE INVENTION

This invention generally pertains to a process for making an inverted silicon-on-insulator semiconductor device having a pedestal structure. Generally, in semiconductor devices and the like, it is desirable to have a high performance device which takes up a relatively small amount of space. Commonly, semiconductor devices have suffered performance wise because there has been a relatively high amount of base-collector and collector-substrate capacitance. Additionally, defects which occur during growth of the epitaxial region result in decreased yield. Therefore, it is highly desirable that a semiconductor device having a relatively low capacitance along with a limited number of defects in the epitaxial region be manufactured. The present invention allows for the processing of a semiconductor device using a pedestal structure which utilizes a relatively small area. Further, the semiconductor device has an extremely high quality epitaxial region and capacitance is reduced due to a diffusion barrier dielectric which is disposed between silicon regions.

SUMMARY OF THE INVENTION

The present invention pertains to a process for making an inverted silicon-on-insulator semiconductor device having a pedestal structure. In the present invention, after initial processing steps which include the formation of dielectric layers, the formation of polysilicon layers, the selective growth of an epitaxial region and the deposition of a nitride layer, the semiconductor device is inverted and a new substrate is bonded to the semiconductor device. Following this bonding, the original substrate is removed and the epitaxial region is etched below the first dielectric layer. This allows for defects introduced in the epitaxial region during substrate removal to be removed. The inversion also allows for the avoidance of defects in the epitaxial region itself. The inversion is performed without the fabrication of tubs so that each device uses less space and the semiconductor device layout may be varied. Additionally, a nitride layer acts as a diffusion barrier between the collector and the new substrate thereby reducing the base-collector and collector-substrate capacitance and allows for a semiconductor device capable of a much higher performance. The process may be varied so that many types of semiconductor devices including PNP and NPN bipolar devices, vertical MOSFETS and horizontal MOSFETS may be fabricated using the present invention.

It is an object of the present invention to provide a new and improved process for making an inverted silicon-on-insulator semiconductor device having a pedestal structure which has a relatively low base-collector and collector-substrate capacitance.

It is a further object of the present invention to provide a new and improved process for making an inverted silicon-on-insulator semiconductor device having a pedestal structure which implements a single bonding step of a wafer to achieve the silicon-on-insulator structure.

It is a further object of the present invention to provide a new and improved process for making an inverted silicon-on-insulator semiconductor device having a pedestal structure wherein the semiconductor devices are not processed in tubs.

It is a further object of the present invention to provide a new and improved process for making an inverted silicon-on-insulator semiconductor device having a pedestal structure wherein the device has improved isolation of the epitaxial region.

It is a further object of the present invention to provide a new and improved process for making an inverted silicon-on-insulator semiconductor device having a pedestal structure which allows for the highest quality material of the epitaxial region to be where the emitter will be processed.

It is a further object of the present invention to provide a new and improved process for making an inverted silicon-on-insulator semiconductor device having a pedestal structure wherein the process may be varied slightly to make various types of semiconductor devices.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Referring specifically to FIGS. 1–7, highly enlarged cross-sectional views of an inverted silicon-on-insulator semiconductor device having a pedestal structure are shown during initial stages of processing. Initially, a first substrate, 10, is provided. A first dielectric layer, 12, is then formed on first substrate 10. Next, a first polysilicon layer, 14, is deposited on first dielectric layer 12. Once first polysilicon layer 14 has been deposited, first polysilicon layer 14 is doped in a first conductivity type. In this embodiment, the first conductivity type is P+. Following the doping, first polysilicon layer 14 is patterned and etched. Next, a second dielectric layer, 16, is formed on first polysilicon layer 14. This is followed by the deposition of a second polysilicon layer, 18. Second polysilicon layer 18 is doped in a second conductivity type. In this embodiment, the second conductivity type is N+. It should be understood that first polysilicon layer 14 and second polysilicon layer 18 are doped in opposite conductivity types. Once the doping of second polysilicon layer 18 has been accomplished, second polysilicon layer 18 is patterned and etched in a predetermined manner. A third dielectric layer, 20, is now formed on second polysilicon layer 18.

Referring specifically to FIGS. 8–11, highly enlarged cross-sectional views of an inverted silicon-on-insulator semiconductor device having a pedestal structure are shown during various stages of processing. Once third dielectric layer 20 has been formed, an opening, 22, is patterned and etched. Opening 22 extends to first substrate 10 through first dielectric layer 12, second dielectric layer 16, third dielectric layer 20, first polysilicon layer 14 and second polysilicon layer 18. Once opening 22 has been etched, an epitaxial region, 24, is grown therein. Epitaxial region 24 is selectively grown so that it grows upward from first substrate 10. During or directly following the growth of epitaxial region 24, a collector, 44, is implanted in epitaxial region 24. It should be understood that collector 44 will be of the same conductivity type as second polysilicon layer 18, here, N+. Following the implantation of collector 44, a fourth dielectric layer, 26, is formed on third dielectric layer 20 and epitaxial region 24. Next, a nitride layer, 28, is deposited on fourth dielectric layer 26.

A second substrate, 30, is now bonded on nitride layer 28. Second substrate 30 may be bonded many ways however, epoxy bonding is commonly used. Other bonding methods may include deposition of an oxide layer (not shown) on nitride layer 28 before bonding. This process enables the silicon-on-insulator structure to be achieved using only one bonding step. Once second substrate 30 has been bonded to nitride layer 28, first substrate 10 may now be removed. Generally, first substrate 10 is removed by either grinding, etching or a combination of both grinding and etching. However, it should be understood that other methods of removing first substrate 10 may be employed.

Figure 1:
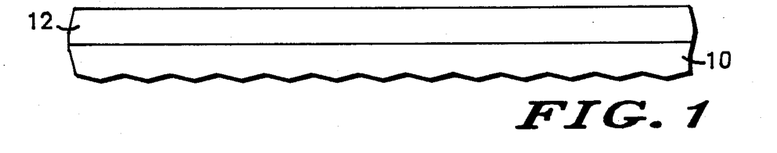
FIGS. 1–15, 17, 19 and 20 are highly enlarged cross-sectional views of an inverted silicon-on-insulator semiconductor device having a pedestal structure during various steps of processing.
Figure 2:
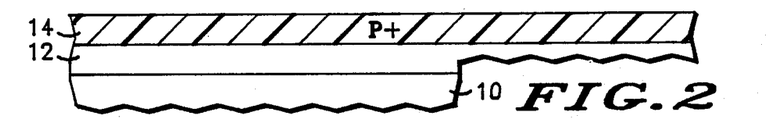
Figure 3:
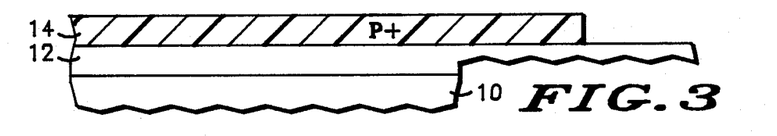
Figure 4:
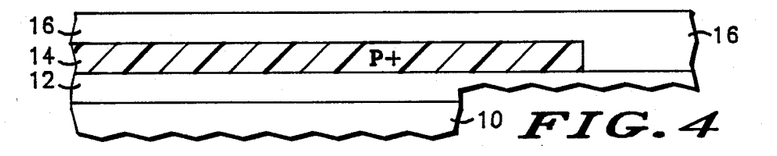
Figure 5:
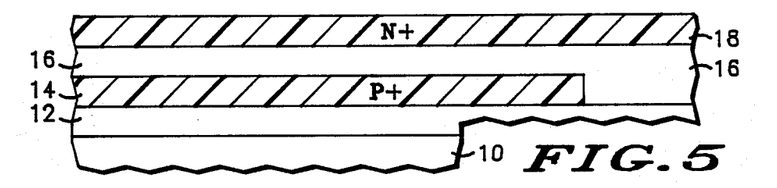
Figure 6:
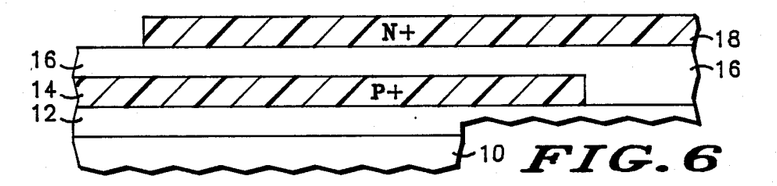
Figure 7:
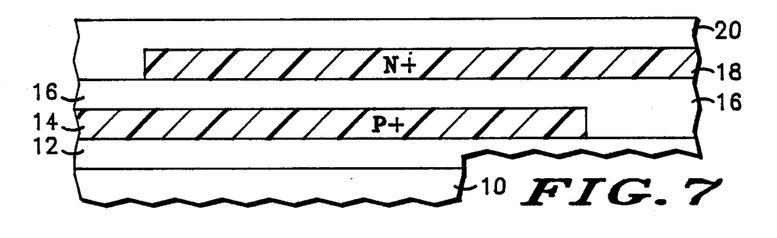
Figure 8:
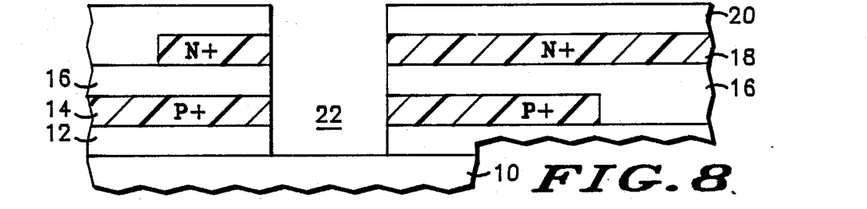
Figure 9:
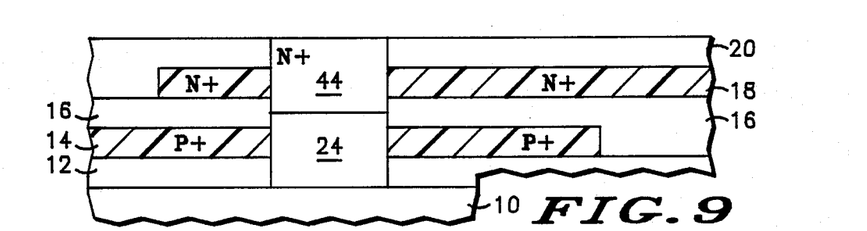
Figure 10:
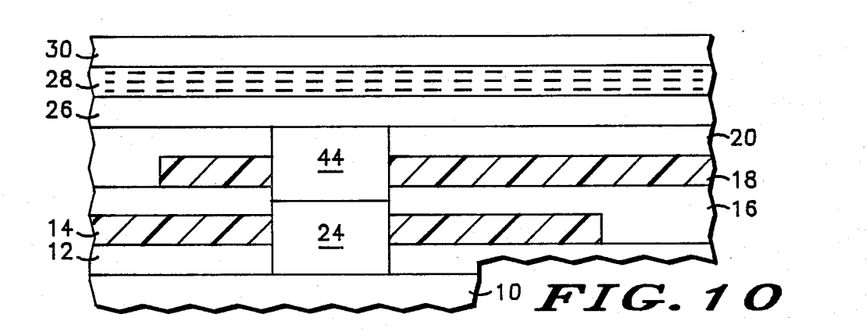
Figure 11:
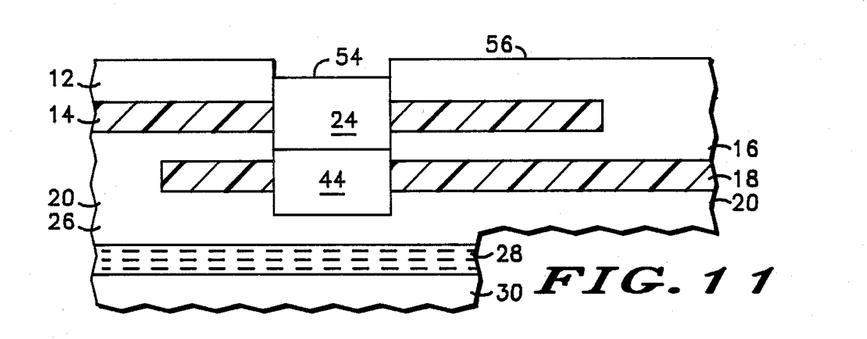

Following the removal of first substrate 10, epitaxial region 24 is reduced so that a first surface, 54, of epitaxial region 24 lies in plane which is below the uppermost surface, 56, of first dielectric layer 12 (see FIG. 11). This reduction allows for the removal of any defects formed during the removal of first substrate 10. Therefore, higher performance may be obtained because epitaxial region 24 is of a high quality. It should be understood that although the inverting step occurs following the removal of first substrate 10 in this embodiment, it may occur anytime after the deposition of nitride layer 28.

Figure 12:
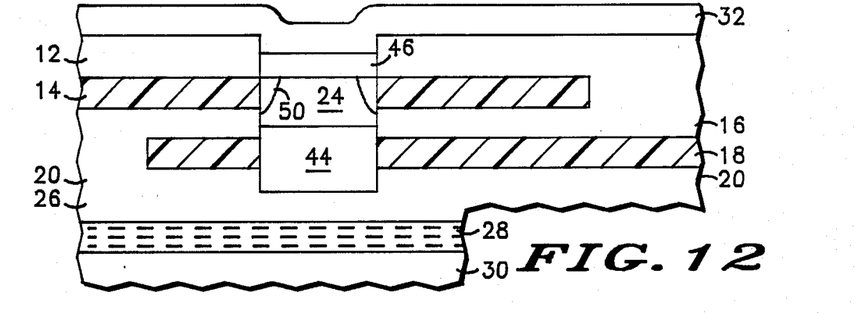
Figure 13:
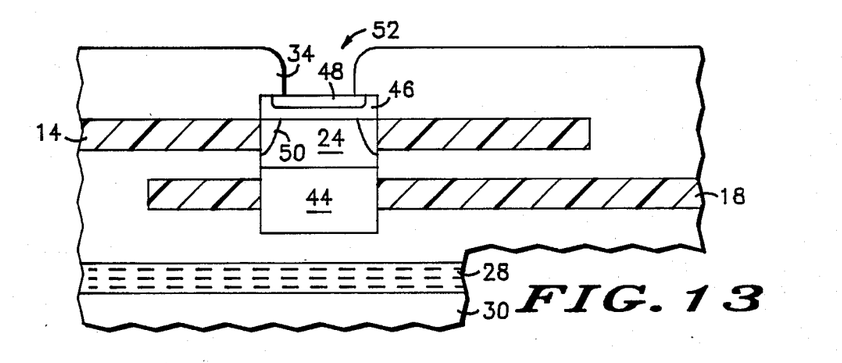
Figure 14:
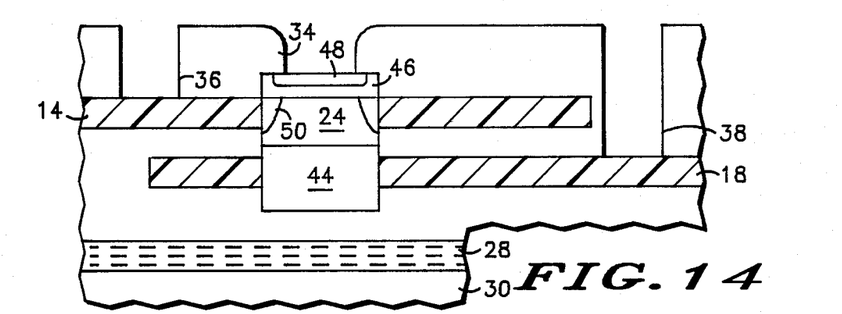
Figure 15:
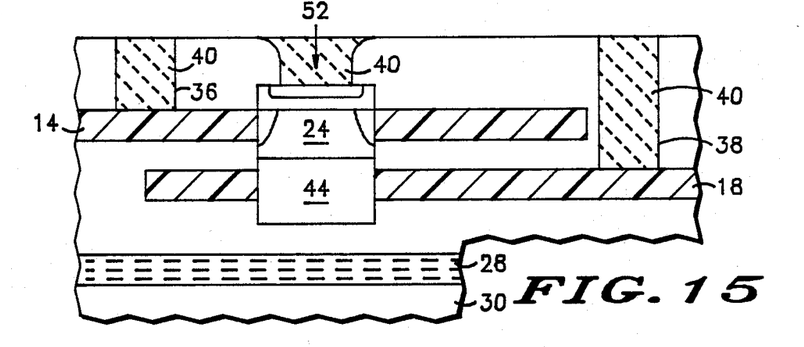

Referring specifically to FIGS. 12–15, highly enlarged cross-sectional views of an inverted silicon-on-insulator semiconductor device having a pedestal structure are shown during various stages of processing. Following the inversion of the semiconductor device, a base, 46, is implanted in epitaxial region 24. Base 46 must correspond to the conductivity type of first polysilicon layer 14, P+ in this embodiment. FIG. 12 shows diffusion regions, 50, wherein the dopant of the conductivity type of first polysilicon layer 14 has diffused into epitaxial region 24 and base 46 of epitaxial region 24. Following the implantation of base 46, a sidewall spacer oxide layer 32, is formed on first oxide layer 12 and epitaxial region 24. Following the formation, sidewall spacer oxide layer 32 is partially etched over epitaxial region 24. This allows for the formation of sidewall spacers, 34. An emitter contact opening, 52, lies between sidewall spacers 34. Once sidewall spacers 34 have been processed, an emitter, 48, may be implanted in epitaxial region 24. Again, due to the reduction of epitaxial region 24, the emitter is very high quality epitaxial material. Generally, emitter 48 is of the same conductivity type as collector 44. Sidewall spacers 34 serve to reduce the size of emitter 48. The size of emitter 48 may be reduced even further than is shown depending upon how far sidewall spacers 34 reduce emitter contact opening 52.

Following the formation of emitter 48, a first contact opening, 36, and a second contact opening, 38 are patterned and etched. First contact opening 36 extends to first polysilicon layer 14 while second contact opening 38 extends to second polysilicon layer 18. In this embodiment, first contact opening 36, second contact opening 38 and emitter contact opening 52 have contact polysilicon, 40, deposited therein. This is can be done by depositing contact polysilicon 40 in the contact openings until it is over the thick oxide of first oxide layer 12 and sidewall spacer oxide layer 32. Next, contact polysilicon 40 and the thick oxide are planarized and etched back. Following the deposition and planarization of contact polysilicon 40, contact polysilicon 40 is doped. Contact polysilicon 40 in first contact opening 36 is doped in the same conductivity type as first polysilicon layer 14. Contact polysilicon 40 in second contact opening 38 is doped in the same conductivity type as second polysilicon layer 18. Contact polysilicon 40 in emitter contact opening 52 is doped in the same conductivity type as emitter 48. The formation of emitter 48 may occur as contact polysilicon 40 in emitter contact opening 52 is doped rather than prior to the deposition of contact polysilicon 40. Once contact polysilicon 40 is doped, the device is annealed to insure proper diffusion.

Figure 16:
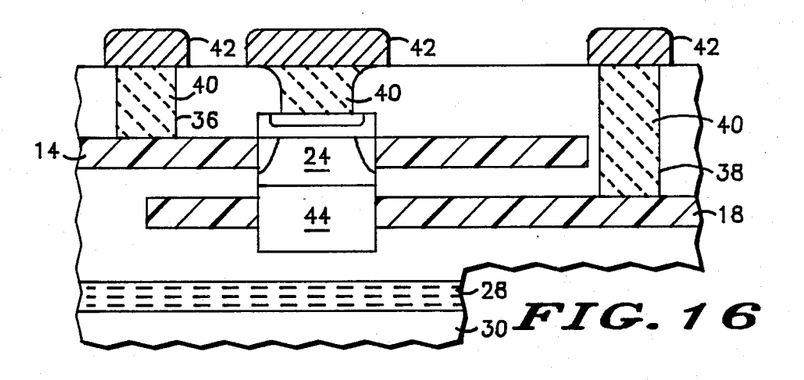
FIGS. 16, 18 and 21 are highly enlarged cross-sectional views of inverted silicon-on-insulator semiconductor devices having pedestal structures.

Referring specifically to FIG. 16, a highly enlarged cross-sectional view of an inverted silicon-on-insulator semiconductor device having a pedestal structure is shown. The device in this embodiment is bipolar. A plurality of metal contacts, 42, are processed on first contact opening 36, second contact opening 38, and emitter contact opening 52. Metal contacts 42 are processed by methods which are well known in the art.

Figure 17:
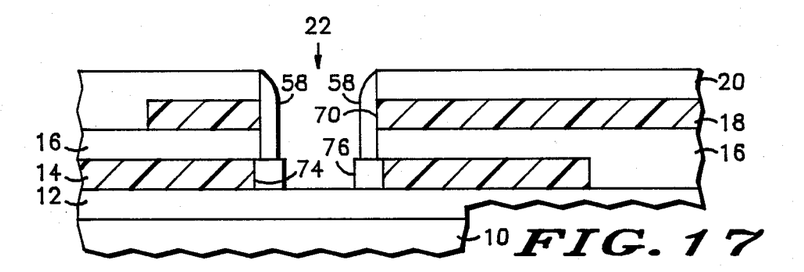
Figure 18:
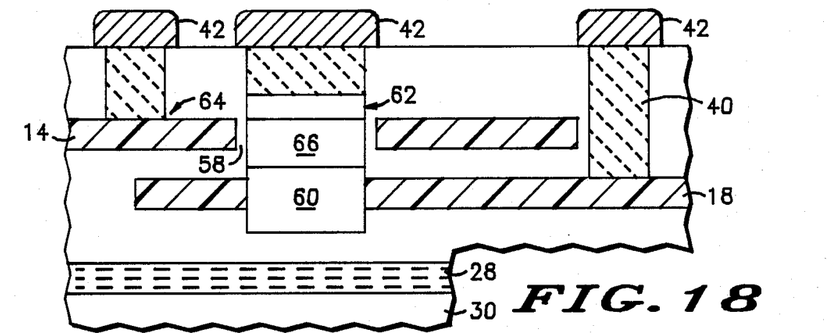

Referring specifically to FIGS. 17–18, highly enlarged cross-sectional views of an inverted silicon-on-insulator semiconductor device having a pedestal structure are shown during and following processing, respectively. This embodiment of the present invention shows a vertical MOS device. After opening 22 has been partially etched so that edges, 70, of second polysilicon layer 18 have been exposed, nitride edges, 58, remain on each exposed edge 70 of second polysilicon layer 18 following the formation and etching of a nitride edge layer (not shown). Next, opening 22 is etched through first polysilicon layer 14 to expose edges, 74, of first polysilicon layer 14. Then, oxide edges, 76, are grown on edges 74. Once this has been done, nitride edges 58 are removed so that edges 70 are exposed in opening 22. Oxide edges 76 serve to isolate first polysilicon layer 14 from epitaxial region 24. It should be understood that there are many ways in which nitride edges 58 and oxide edges 76 may be formed.

In this embodiment of the present invention, sidewall spacers 34 (See FIG. 13) may or may not be utilized. They are not needed, however, they may be included so that there is minimal variance between the processing of a bipolar device and a vertical MOS device. Additionally, because FIG. 18 is an MOS device, it is shown to have a drain, 60, a source, 62, a gate, 64, and a bulk, 66. The processing steps of the vertical MOS device are otherwise essentially the same as those of the bipolar device.

Figure 19:
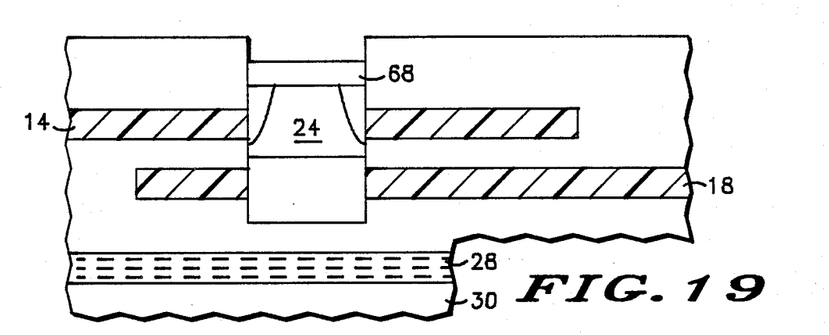
Figure 20:
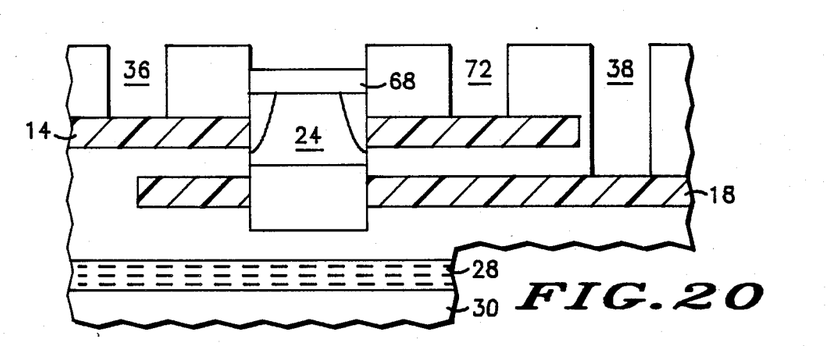
Figure 21:
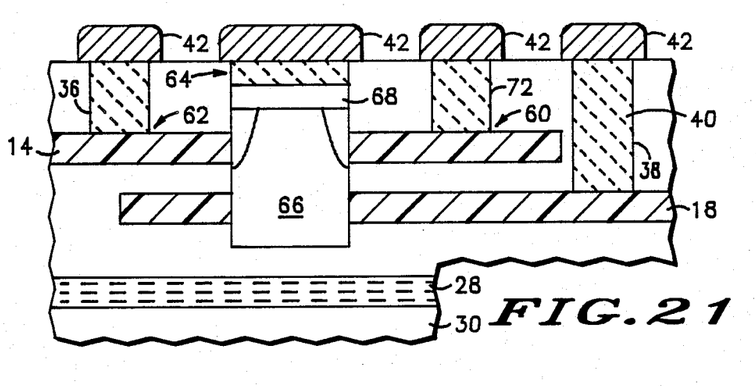

Referring specifically to FIGS. 19–21, highly-enlarged cross-sectional views of an inverted silicon-on-insulator semiconductor device having a pedestal structure are shown during and following processing, respectively. This embodiment of the present invention shows a horizontal MOS device. Following the reduction of epitaxial region 24, a gate oxide layer, 68, is formed on epitaxial region 24. FIG. 20 shows that this embodiment includes a third contact opening, 72. Third contact opening 72 extends to first polysilicon layer 14.

FIG. 21 shows that third contact opening 72 becomes the contact for drain 60 while first contact opening 36 becomes the contact for source 62. Additionally, second contact opening 38 becomes the contact for bulk 66. It must be understood that drain 60 and source 62 must be completely separated. Again, sidewall spacers 34 may or may not be included for the same reasons discussed earlier.

In the present invention, first dielectric layer 12, second dielectric layer 16, third dielectric layer 20 and fourth dielectric layer 26 may be comprised of an oxide, a nitride, or various combinations of oxides and nitrides. Additionally, it should be understood that this process of making an inverted silicon-on-insulator semiconductor device having a pedestal structure may be used to fabricate a multiplicity of devices on a single substrate. The pedestal structure of the present invention enables a semiconductor device which is more compact to be processed. Further, nitride layer 28 serves as a diffusion barrier between collector 44 and second substrate 30. Because of the improved isolation of epitaxial region 24 in the present invention, base-collector and collector-substrate capacitance is greatly reduced and the result is much higher performance in the semiconductor device.

Thus it is apparent that there has been provided, in accordance with the invention, a process for making an inverted silicon-on-insulator semiconductor device having a pedestal structure which meets the objects and advantages set forth above. While specific embodiments of this invention have been shown and described, further modifications and improvements will occur to those skilled in the art. It is desired that it be understood, therefore, that this invention is not limited to the particular form shown and it is intended that the appended claims cover all modifications which do not depart from the spirit and scope of this invention.

What is claimed:

1. A process for making an inverted silicon-on-insulator semiconductor device having a pedestal structure comprising the steps of:
   providing a first substrate;
   forming a first dielectric layer on said first substrate;
   forming a first polysilicon layer on said first dielectric layer;
   forming a second dielectric layer on said first polysilicon layer;
   forming a second polysilicon layer on said second dielectric layer;
   forming a third dielectric layer on said second polysilicon layer;
   etching an opening through said dielectric layers and said polysilicon layers, said opening extending to said first substrate;
   forming epitaxial region on said first substrate in said opening;
   forming a last dielectric layer on said epitaxial region and said third dielectric layer;
   bonding a second substrate to said last dielectric layer;
   inverting said semiconductor device;
   removing said first substrate;
   etching a plurality of contact openings in said semiconductor device; and
   forming electrical contacts in said contact openings.

2. The process of claim 1 wherein the first polysilicon layer is doped in a first conductivity type and the second polysilicon layer is doped in a second conductivity type.

3. The process of claim 2 wherein the first conductivity type is P+ and the second conductivity type is N+.

4. The process of claim 2 further comprising the steps of:
   forming a collector in the epitaxial region one of during or after the growth of said epitaxial region;
   forming a base in said epitaxial region; and
   forming an emitter in said epitaxial region.

5. The process of claim 4 wherein means for limiting the emitter size is processed before the implantation of said emitter.

6. The process of claim 2 further comprising the steps of:
   forming a gate oxide layer on the epitaxial region;
   forming a gate on said gate oxide layer; and
   forming a source and a drain in the first polysilicon layer, said source and drain not being physically or electrically connected.

7. A process for making an inverted silicon-on-insulator semiconductor device having a pedestal structure comprising the steps of:
   providing a first substrate;
   forming a first dielectric layer on said first substrate;
   forming a first polysilicon layer on said first dielectric layer, said first polysilicon layer being doped in a first conductivity type;
   forming a second dielectric layer on said first polysilicon layer;
   forming a second polysilicon layer on said second dielectric layer, said second polysilicon layer being doped in a second conductivity type;
   forming a third dielectric layer on said second polysilicon layer;
   etching an opening through said dielectric layers and said polysilicon layers, said opening extending to said first substrate;
   forming oxide edges in said opening on said first polysilicon layer;
   forming an epitaxial region on said first substrate in said opening;
   forming a drain in said epitaxial region;
   forming a gate in said first polysilicon layer;
   forming a source in said epitaxial;
   forming a last dielectric layer on said epitaxial region and said third dielectric layer;
   bonding a second substrate to said last dielectric layer;
   inverting said semiconductor device; and
   removing said first substrate.

8. A process for making an inverted silicon-on-insulator semiconductor device having a pedestal structure comprising the steps of:
   providing a first substrate;
   forming a first dielectric layer on said first substrate;
   forming a first polysilicon layer on said first dielectric layer;
   doping said first polysilicon layer;
   patterning and etching said doped first polysilicon layer;
   forming a second dielectric layer on said first polysilicon layer;
   forming a second polysilicon layer on said second dielectric layer;
   doping said second polysilicon layer;

patterning and etching said doped second polysilicon layer;

forming a third dielectric layer on said second polysilicon layer;

patterning and etching an opening through said first, second and third dielectric layers as well as said first and second polysilicon layers, said opening extending to said first substrate;

forming an epitaxial region on said first substrate in said opening;

forming a fourth dielectric layer on said epitaxial region and said third dielectric layer;

forming a nitride layer on said fourth dielectric layer;

providing a second substrate;

bonding said second substrate to said nitride layer;

removing said first substrate from said semiconductor device;

inverting said semiconductor device;

patterning and etching a plurality of contact openings in said semiconductor device; and forming metal contacts in said contact openings.

9. The process of claim 8 wherein the first polysilicon layer is doped in a first conductivity type and the second polysilicon layer is doped in a second conductivity type.

10. The process of claim 9 wherein the first conductivity type is P+ and the second conductivity type is N+.

11. The process of claim 9 wherein the inverting step may be performed, anywhere between the depositing a nitride layer step and the patterning and etching step.

12. The process of claim 9 wherein the epitaxial region is etched so that a first surface of said epitaxial region is in a plane below the plane which includes the first surface of the first dielectric layer, said step occurring after the semiconductor device is inverted.

13. The process of claim 12 further comprising the steps of:

forming a collector in the epitaxial region one of during or after the formation of said epitaxial region;

forming a base in said epitaxial region; an forming an emitter in said epitaxial region.

14. The process of claim 13 further comprising the steps of:

forming a sidewall spacer oxide layer on the first dielectric layer and the epitaxial region; and partially etching the portion of the said sidewall spacer oxide layer which covers said epitaxial region thereby forming sidewall spacers.

15. The process of claim 12 further comprising the steps of:

forming a gate oxide layer on the epitaxial region;

forming a gate on said gate oxide layer; and forming a source and a drain in the first polysilicon layer, said source and said drain not being physically or electrically connected.

16. The process of claim 9 wherein the contact polysilicon is deposited in all contact openings and doped accordingly.

17. The process of claim 9 wherein the first, second, third and fourth dielectric layers are comprised of an oxide.

18. The process of claim 9 wherein the first, second, third and fourth dielectric layers are comprised of a nitride.

19. The process of claim 9 wherein the first, second, third and fourth dielectric layers are comprised of oxide and nitride in various combinations.

20. The process of claim 8 wherein said process is used to fabricate a multiplicity of semiconductor devices on a single substrate.

21. A process for making an inverted silicon-on-insulator semiconductor device having a pedestal structure comprising the steps of:

providing a first substrate;

forming a first dielectric layer on said first substrate;

forming a first polysilicon layer on said first dielectric layer, said first polysilicon layer being doped in a first conductivity type;

patterning and etching said first polysilicon layer;

forming a second dielectric layer on said first polysilicon layer;

forming a second polysilicon layer on said second dielectric layer, said second polysilicon layer being doped in a second conductivity type;

patterning and etching said second polysilicon layer;

forming a third dielectric layer on said second polysilicon layer;

patterning and etching an opening through said first, second and third dielectric layers as well as said first and second polysilicon layers, said opening extending to said first substrate;

forming oxide edges in said opening on the first polysilicon layer;

forming an epitaxial region on said first substrate in said opening;

forming a drain in said epitaxial region;

forming a gate in said first polysilicon layer;

forming a source in said epitaxial region;

forming a fourth dielectric layer on said epitaxial region and said third dielectric layer;

forming a nitride layer on said fourth dielectric layer;

providing a second substrate;

bonding said second substrate to said nitride layer;

removing said first substrate from said semiconductor device;

inverting said semiconductor device; and etching said epitaxial region so that a first surface is in a plane below a plane which includes the first surface of said first dielectric layer.

* * * * *